(12) United States Patent
Shepard et al.

(10) Patent No.: US 8,116,109 B2
(45) Date of Patent: Feb. 14, 2012

(54) LOW-COST HIGH-DENSITY RECTIFIER MATRIX MEMORY

(76) Inventors: Daniel R. Shepard, North Hampton, NH (US); Thomas A. Langdo, Cambridge, MA (US); Arthur J. Pitera, Brookline, MA (US)

( * ) Notice: Subject to any disclaimer, the term of this patent is extended or adjusted under 35 U.S.C. 154(b) by 0 days.

(21) Appl. No.: 13/065,755

(22) Filed: Mar. 29, 2011

(65) Prior Publication Data

US 2011/0176349 A1 Jul. 21, 2011

Related U.S. Application Data

(63) Continuation of application No. 12/265,456, filed on Nov. 5, 2008, now Pat. No. 7,933,133.

(60) Provisional application No. 60/985,368, filed on Nov. 5, 2007.

(51) Int. Cl.
*G11C 5/02* (2006.01)
*G11C 5/06* (2006.01)
*G11C 11/00* (2006.01)
*G11C 11/36* (2006.01)

(52) U.S. Cl. ............ 365/51; 365/63; 365/130; 365/163; 365/175

(58) Field of Classification Search ................ 365/51
See application file for complete search history.

(56) References Cited

U.S. PATENT DOCUMENTS

| | | | | |
|---|---|---|---|---|
| 5,148,256 | A * | 9/1992 | Potash et al. ................. 257/50 |
| 7,359,279 | B2 * | 4/2008 | Fasoli et al. .............. 365/230.06 |
| 7,463,546 | B2 * | 12/2008 | Fasoli et al. .............. 365/230.06 |
| 7,646,664 | B2 * | 1/2010 | Cho et al. ................ 365/230.06 |
| 2003/0176034 | A1 * | 9/2003 | Jackson et al. ................ 438/237 |

* cited by examiner

Primary Examiner — Son Mai

(57) ABSTRACT

A high-density memory device is fabricated three-dimensionally in layers. To keep points of failure low, address decoding circuits are included within each layer so that, in addition to power and data lines, only the address signal lines need be interconnected between the layers.

17 Claims, 6 Drawing Sheets

FRONT VIEW     SIDE VIEW

LOW-COST HIGH-DENSITY RECTIFIER MATRIX MEMORY

CROSS-REFERENCE TO RELATED APPLICATIONS

This application is a continuation of U.S. patent application Ser. No. 12/265,456, filed on Nov. 5, 2008, now U.S. Pat. No. 7,933,133, which claims priority to and the benefit of U.S. Provisional Patent Application Ser. No. 60/985,368, filed on Nov. 5, 2007, which is hereby incorporated herein by reference in its entirety.

CROSS-REFERENCE TO RELATED PATENTS

This application makes reference to U.S. Pat. No. 5,889,694 for a "Dual-Addressed Rectifier Storage Device" issued Mar. 30, 1999, to U.S. Pat. No. 5,673,218 for a "Dual-Addressed Rectifier Storage Device" issued Sep. 30, 1997, and to U.S. Pat. No. 3,245,051 for "Information Storage Matrices" issued Apr. 5, 1966; these patents are hereby incorporated herein by reference in their entirety.

FIELD OF THE INVENTION

In various embodiments, the present invention relates to semiconductor storage devices, and more particularly to low-cost, three-dimensional memory devices which incorporate efficient testing mechanisms and utilize manufacturing efficiencies.

BACKGROUND

Many versions of three-dimensional memory arrays have been disclosed in the prior art and may be classified as being one of two types: layered and stacked. Layered approaches utilize a technique for bonding two or more memory chips one on top another to form a three-dimensional memory array. There have been variations on this design, such as a design that uses an enhancement comprising heat sink layers that are bonded between memory circuit layers to help reduce overheating.

Of greater interest to the present invention are approaches for manufacturing a layered memory device based on placing diode storage devices at the intersections of the rows and columns within each layer or for manufacturing an electrically programmable read-only memory. Both of these designs involve devices that are manufactured on a semiconductor substrate having decoding logic for the associated bit lines of the memory layers.

All of these designs, however, have shortcomings. The bonding together of multiple chips creates many points of failure and has high associated assembly costs. Manufacturing devices in layers as disclosed in the prior art has the high cost of the base substrate and its electronic circuitry (manufactured using traditional semiconductor manufacturing means) and its associated complexity as well as the many potential points of failure of interconnecting the vast number of row and column bit lines of the various layers.

As advances continue to be made in the area of high density semiconductor storage, the need to keep the cost of these devices low is critical for many applications. Many storage solutions, such as flash memory (a non-volatile, rewritable memory technology), are currently very expensive. As a result, many users of flash memory must upload and download the contents of their memory to other storage means, such as a computer with a hard disk. This is because flash is so expensive that rather than have many flash memory devices, users will typically own very few flash memory devices which they will reuse depending on their current needs. Clearly, a need exists for a low-cost, high-reliability three-dimensional memory device.

SUMMARY

In various embodiments, the present invention describes a multi-layer, three-dimensional memory device that includes decoding circuitry on each memory layer, thereby eliminating the need for a base layer comprising bit-line decoding circuitry and dramatically reducing the number of layer interconnects to just power and a few address and data lines. In various embodiments, the present invention describes high-density rectifier matrices—as might be used to construct electronic memory—such that the costs are kept low. By constructing memory devices in three dimensions and integrating simple test circuitry that can rapidly verify the operation of such devices, storage densities can be made very high while keeping testing time and cost very low.

Embodiments of the present invention also offer advantages over existing technology in that this memory technology may be added to a variety of existing semiconductor devices. In addition, a one-time-programmable variation of the device may be realized. Finally, embodiments of the present invention offer advantages over existing technology in that this memory technology, by virtue of its exceptionally simple design, will retain its cost savings even when manufactured three-dimensionally in layers.

In general, in a first aspect, embodiments of the invention include an electronic memory device including a plurality of layers of circuitry. A first layer includes storage circuitry for storing and facilitating retrieval of information, a second layer includes decoding circuitry for selecting information in the storage circuitry, and a third layer comprises a plurality of buffer drivers for providing an encoded signal to the decoding circuitry.

One or more of the following features may be included. The first layer and the third layer may be different layers. The third layer may include a substrate disposed beneath the first layer. The first layer may be connected to the third layer by conductive vias. Each of the plurality of buffer drivers may include or consist essentially of a transistor. Each transistor may be an NMOS transistor and/or a thin-film transistor. The electronic memory device may further include a plurality of additional first layers and second layers, at least some of them residing on a single physical layer.

The storage circuitry for storing and facilitating retrieval of information may include first and second pluralities of generally parallel conductors; the second plurality may overlap and be generally orthogonal to the first, and a plurality of nonlinear conductive devices. Each device may be connected to the first plurality of generally parallel conductors at approximately a point of overlap between the first and second pluralities of generally parallel conductors. At least one of the plurality of nonlinear conductive devices may be connected to the second plurality of generally parallel conductors at approximately a point of overlap between the first and second pluralities of generally parallel conductors. Each of the plurality of nonlinear conductive devices may include a diode, a fuse, an antifuse, and/or a phase-change material.

The decoding circuitry may include circuitry for causing a first voltage on a selected one of the first plurality of generally parallel conductors to differ from voltages on the others of the first plurality of generally parallel conductors and circuitry for causing a second voltage on a selected one of the second plurality of generally parallel conductors to differ from voltages on the others of the second plurality of generally parallel conductors. The first and second voltages may differ sufficiently to forward bias a nonlinear conductive device at the point of overlap between the selected one of the first plurality of generally parallel conductors and the selected one of the second plurality of generally parallel conductors. A voltage differential between the non-selected ones of the first plurality of generally parallel conductors and the non-selected ones of the second plurality of generally parallel conductors may be insufficient to forward bias a nonlinear conductive device at any point of overlap therebetween. The buffer drivers may be connected between the circuitry for storing and facilitating retrieval of information and the decoding circuitry.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

Described herein are various embodiments of methods and systems involving fabricating semiconductor memory in three dimensions. This memory may be fabricated using a process similar to that used to construct thin film transistor (TFT) flat panel displays—in particular, using deposited semiconductor material on insulating substrates.

Figure 1:
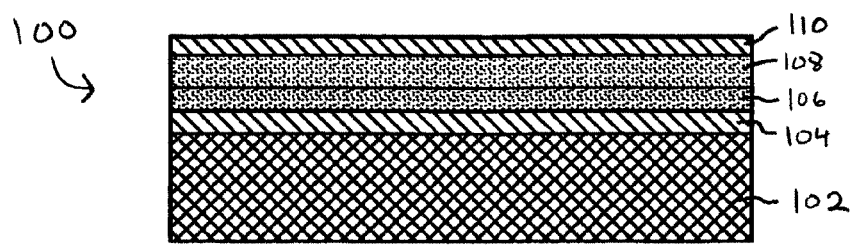
FIG. 1 illustrates a prepared substrate for the present invention.

Referring now to FIGS. 1-7, which show illustrative embodiments of the invention, FIG. 1 shows a representative configuration of a prepared substrate 100. The substrate 100 includes a base 102 that is typically made of glass, silicon dioxide on a silicon wafer, or other insulating material. On top of the base 102 is deposited approximately 1000 Å of a first metal layer 104 including, for example, TiAu (titanium-gold), Ni (nickel), and/or Al (aluminum). Next is deposited approximately 250 Å of N+ amorphous silicon (N+δSi:H) 106 followed by approximately 1000 Å of amorphous silicon δSi:H 108. Finally, approximately 100 Å of a second metal layer 110 is deposited. It should be noted that the metals and the thicknesses are not critical, so long as certain functional requirements are met. The first metal layer 104 may be made of any material that will form an ohmic contact with the N+ amorphous silicon layer 106 above it. The second metal layer 104 may be thick enough to carry enough current to provide the operational speed desired given circuit capacitances. The amorphous silicon layer 108 may include one of many materials that will form an ohmic connection to layers 104 and may be thick enough only to prevent the first metal layer 104 and the amorphous silicon layer 108 from interacting in a non-linear way (i.e., to prevent the layers 104 and 108 from, e.g., forming a rectifying contact). The amorphous silicon layer 108 may include one of many materials that will form a rectifying contact with the second metal layer 110 and need only be thick enough to allow for an adequate junction depth for proper operation of that rectifying contact. The second metal layer 110 may be made of any material that will form a rectifying contact with the amorphous silicon layer 108 below it and need not be very thick because additional metal may be deposited directly on top of this in a later step. Finally, all thicknesses may be thin enough to not create unacceptable aspect ratios (i.e., very tall, thin rows that are too tall for their widths), given the design feature size, when these layers are etched as described below.

Figure 2:
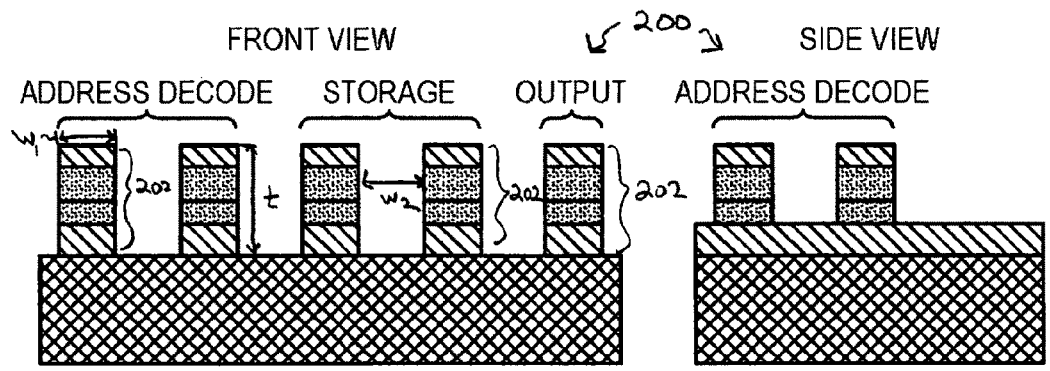
FIG. 2 illustrates a front and side view after etching rows.

FIG. 2 shows, in one embodiment, a front view and a side view of a device 200 after etching steps that resulted in many parallel rows having many "towers" 202 of rectifiers on each of them. Some of the towers 202 may be used for address decoding, some for storage, and others for output. The width $w_1$ of these rows may be proportional to the thickness t of the substrate layers so that the aspect ratios are manageable; if the rows or towers are too tall, given their footprints, they may fall over. The widths $w_2$ of the channels between the rows and towers may be wide enough to minimize interaction of adjacent rows and columns.

Figure 3:
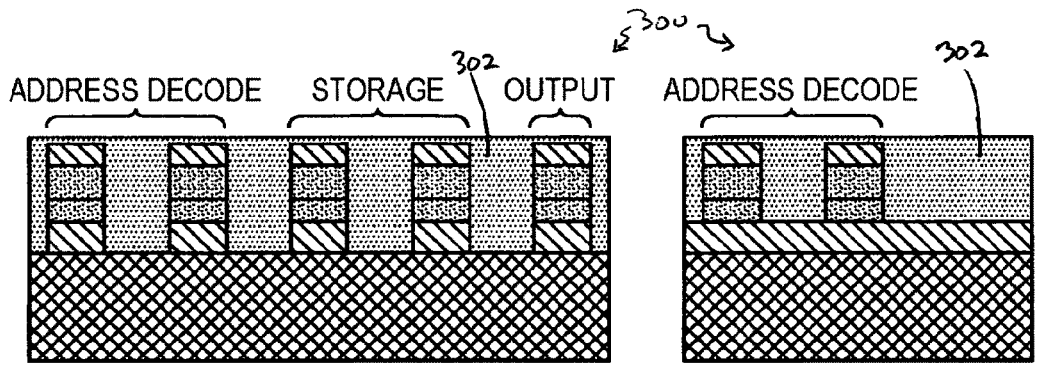
FIG. 3 illustrates a front and side view of the rows following a passivation step.

FIG. 3 shows, in one embodiment, a front view and a side view of a device 300 with rows following passivation, i.e., the channels between the rows and columns are filled in with an insulating material 302 which may provide structural strength, a smooth surface for subsequent photolithography steps, electrical insulation between the sides of the rows and columns and the deposition of the top metal layer for the column connections.

Figure 4:
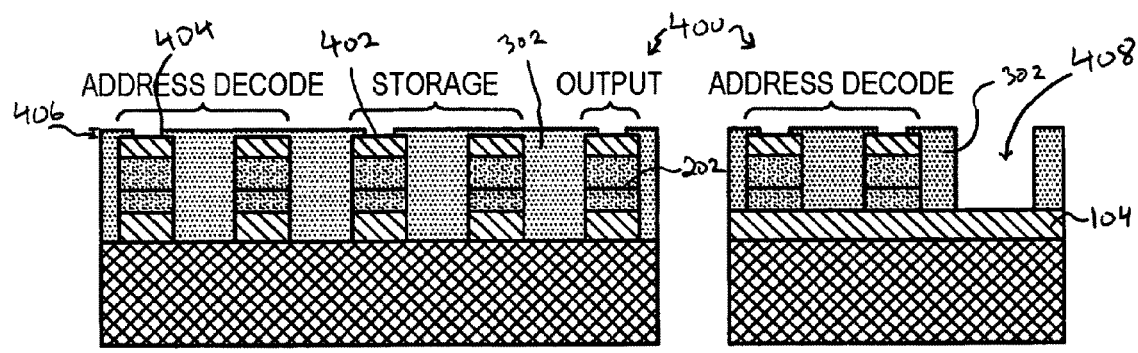
FIG. 4 illustrates a front and side view of the passivated rows following etching to open contacts through the passivation layer.

FIG. 4 shows, in one embodiment, the array following an etch to create openings 404 in the insulating material layer 302 to expose a top surface 402 of the towers 202. The openings 404 are made selectively in order to program the device as described in, for example, U.S. Pat. No. 5,889,694. Note that the thickness 406 of the passivated material 302 on top of those towers where no opening is etched may be sufficient to ensure electrical insulation from a third metal layer yet to be deposited. It should also be noted that all data-bit connections may be opened, e.g., in the case of a programmable or writable device. Such a programmable device may have an additional layer or can otherwise provide for a fusible or antifusible link in each of the towers used for data storage. This additional layer may also be made of a thin-film material that is a phase-change chalcogenide alloy, such as, for example, a film similar to the one used to store information on commercial CD-RW and DVD-RAM optical disks. Note that some of the etches 408 may extend to the first metal layer 104, thereby enabling the formation of direct connections to the bottom metal rows. The steps illustrated in FIGS. 3 and 4 may be partly combined by using a photosensitive spin-on insulator, such as polyimide, which can be deposited and then photolithographically patterned and developed.

Figure 5:
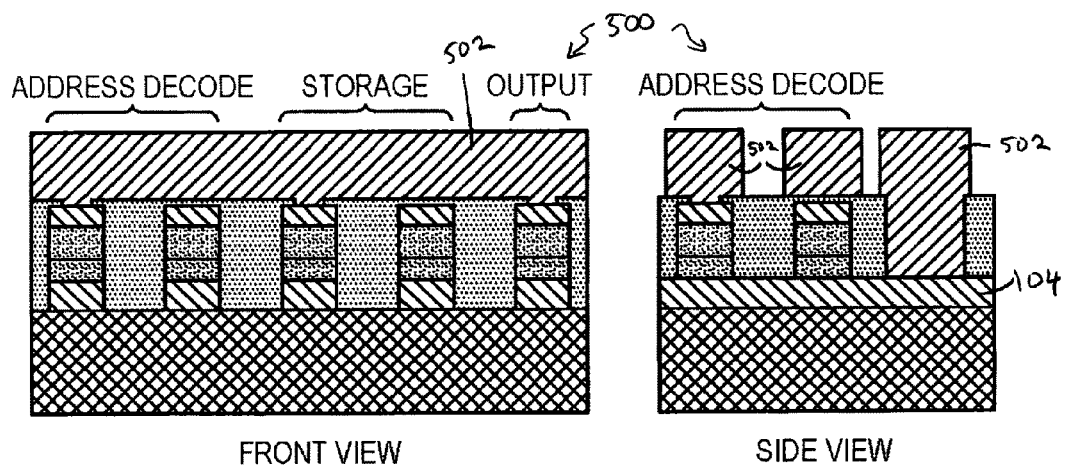
FIG. 5 illustrates a front and side view of the device following final metallization and etching to create columns.

FIG. 5 shows, in one embodiment, front and side views of the final device 500 following the deposition of the third metal layer 502 and the etching of that layer into columns orthogonal to the rows. This process results in a two-dimensional array of rectifying contacts (in this case, Schottky diodes).

The rows may be connected by the third metal layer 502 and the columns may be connected by the first metal layer 104. The third metal layer may be approximately 2000 Å thick, and may be thick enough to carry enough current to provide the operational speed desired given circuit capacitances present, without creating any of the previously mentioned aspect ratio problems when the columns are etched.

In one embodiment, the rectifier matrix memory may be constructed using Schottky-type rectifying contacts. In other embodiments, however, other rectifying structures may be used. For example, the first metal layer 104 and second metal layer 110 may be ohmic so that the junction between the N+ amorphous silicon layer 106 and the amorphous silicon layer 108 forms the rectifying contact. For example, if the N+ amorphous silicon layer 106 is doped N+ and the amorphous silicon layer 108 is doped P+, a P-N rectifying junction may be formed. In alternative embodiments, some other semiconducting material, such as an organic molecule, may be used in place of amorphous silicon. Another embodiment includes multiple rectifying junctions in series. This embodiment may be achieved by constructing a P-N junction and a Schottky junction. With this multiple stacked rectifying towers design, if one of the rectifying devices is defective and forms an ohmic connection instead of a rectifying connection, the others in the series may result in the tower still being a rectifying connection between the top column and the bottom row as required for such a rectifier storage matrix.

Figure 6:
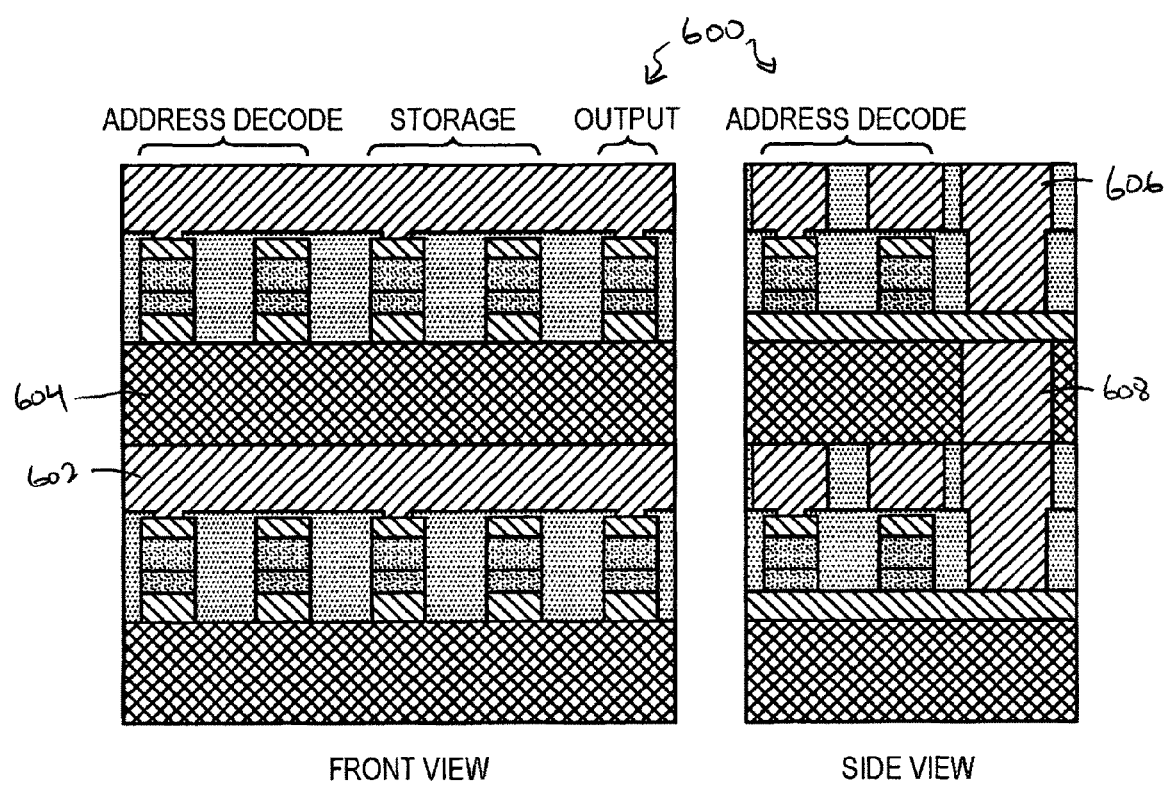
FIG. 6 illustrates a second layer of the device having been manufactured upon a first layer of the device.

FIG. 6 shows front and side views of a structure 600 illustrating the result of this process if it is repeated on a substrate on which it had been previously performed. Note that the topmost layer 602 of the previous process will most likely be planarized with a polishing step before depositing an insulating film 604 to start the second layer. In the case of the DRS memory constructed in multiple layers, these layers can be wired mostly in parallel (as described in U.S. Pat. No. 5,889,694), and only the bonding pads 606 would be interconnected by vias. As can be seen, the structure may be identical except for the inclusion of vias 608 to interconnect the bonding points for power, ground, and the complementary address inputs of each layer. The data bonding pads 606 would be brought to the surface layer independently so that each data bonding pad 606 may connect to a single layer. Other wiring configurations are possible. For example, the data lines of each layer may be interconnected by vias and separation accomplished by having some address lines connected to specific layers so as to, in effect, enable only a single layer at a time and thereby multiplex the data connections. This would be the equivalent of implementing the selective powering of the device as is disclosed in U.S. Pat. No. 5,889,694, whereby each individually powered section of the device is disposed in a separate layer.

Figure 7:
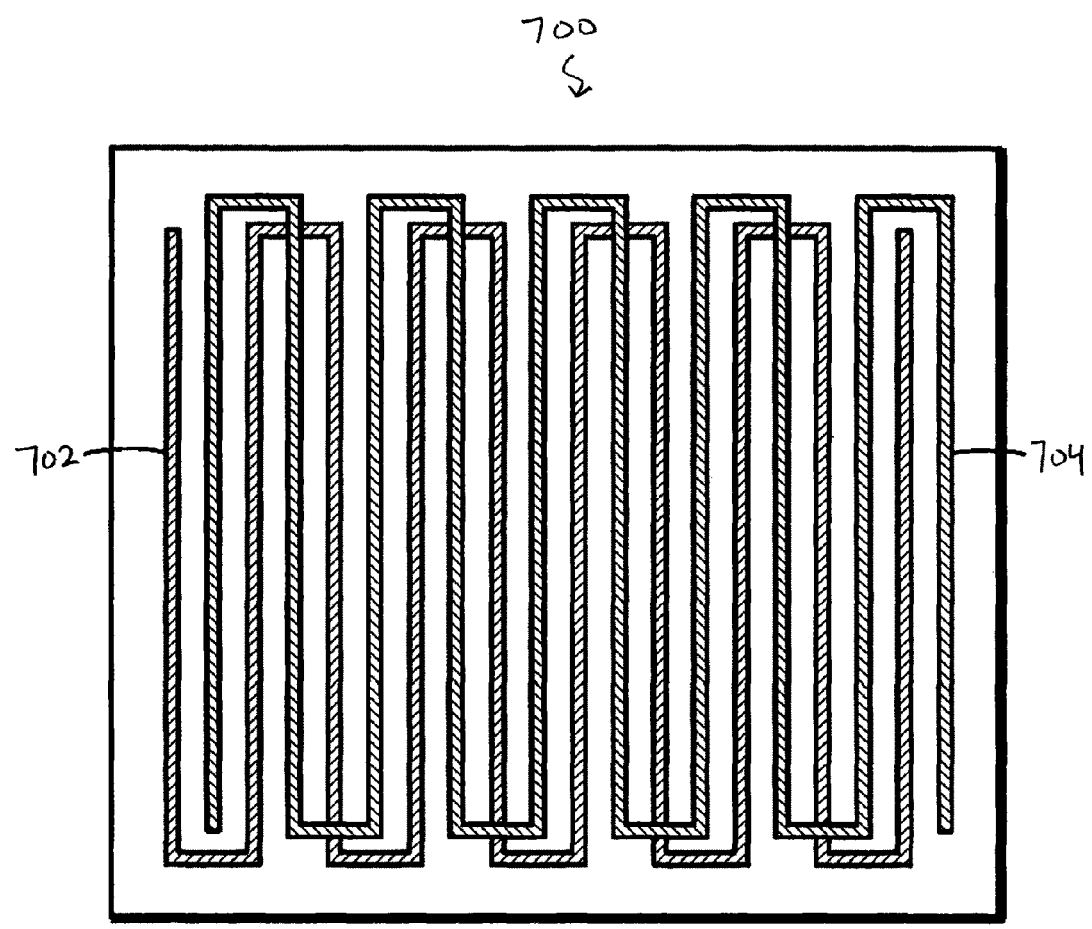
FIG. 7 illustrates an interconnection pattern for quick testing of the device.

FIG. 7 shows a top view of structure 700 illustrating an interconnection technique for the rows (which is repeated for the columns) to enable the quick and inexpensive testing of the device. The most common faults likely to occur during the fabrication of the present invention are breaks in a line or shorts between two adjacent lines. With the present interconnection technique, all the alternate rows are connected end to end with a top layer connection, thereby creating two conductive snakes—one comprising all the even numbered rows 702 and the other comprising all the odd numbered rows 704. As a result, one can test the device by probing the two ends of each snake and checking for continuity. This may enable instantaneous checking of the all the rows for any breaks with just four probe points. Also, shorts between rows may be identified simultaneously by checking for any continuity between the two snakes. The columns may be simultaneously checked in an identical fashion. Also, in the same way and at the same time, the device may be checked for shorts between the top columns and bottom rows (taking care to select one range of voltage levels for the rows and another range of voltage levels for the columns such that the diodes are reverse biased). By combining this test technique with the multiple stacked rectifying towers design, if a device passes this instantaneous test, one can be confident of having a working device. After identifying and optionally discarding any defective devices, these top layer connections are etched away to separate the lines or the edges of the chips where the interconnections are found could be cut back just enough to remove those edges and their interconnections.

This process is initiated by depositing layers on an insulating substrate such as plastic or glass. It should be noted, however, that materials suitable for this insulating substrate are not limited to plastic or glass. As has been shown in the prior art, this process may be performed on top of a normally fabricated semiconductor device such as a memory controller chip, an error detection and correction chip, a data decryption (and, optionally, encryption) chip (such as for security like DES or PGP or for storage efficiency like MP3), or a microprocessor or the like that has been passivated with a top layer of protecting glass or other insulator. An array of LEDs or diode optical sensors can be constructed upon an image processor to construct a micro display or camera. In its simplest form, a diode matrix may be constructed on top of a memory controller comprising the address decoding, the row and column selection logic, the line driver-amplifiers, and the sense amplifiers; in this case, the individual connections to the rows and columns may be made up from the controller substrate. Since a storage array can cover a greater area then, say, a memory controller chip, multiple memory controllers may be placed on the chip to be covered according to the present invention, thereby providing redundant controller circuits to operate the storage array, resulting in higher fabrication yields. Furthermore, this process can be performed on top of itself, resulting in a three-dimensional memory device with many layers. One simply interconnects the two or more layers with vertical via connections. In the case of the DRS memory constructed in multiple layers, these layers can be wired mostly in parallel; just as the DRS array can be divided into multiple areas on one layer (as described in U.S. Pat. No. 5,889,694), these multiple areas may be constructed vertically with this technique.

Other variations include the fabrication of integrated memory circuits using other than traditional photolithographic semiconductor manufacturing techniques. By combining lower cost manufacturing techniques with the higher densities resulting from three-dimensional fabrication, the cost per bit can be driven even lower.

Figure 8:
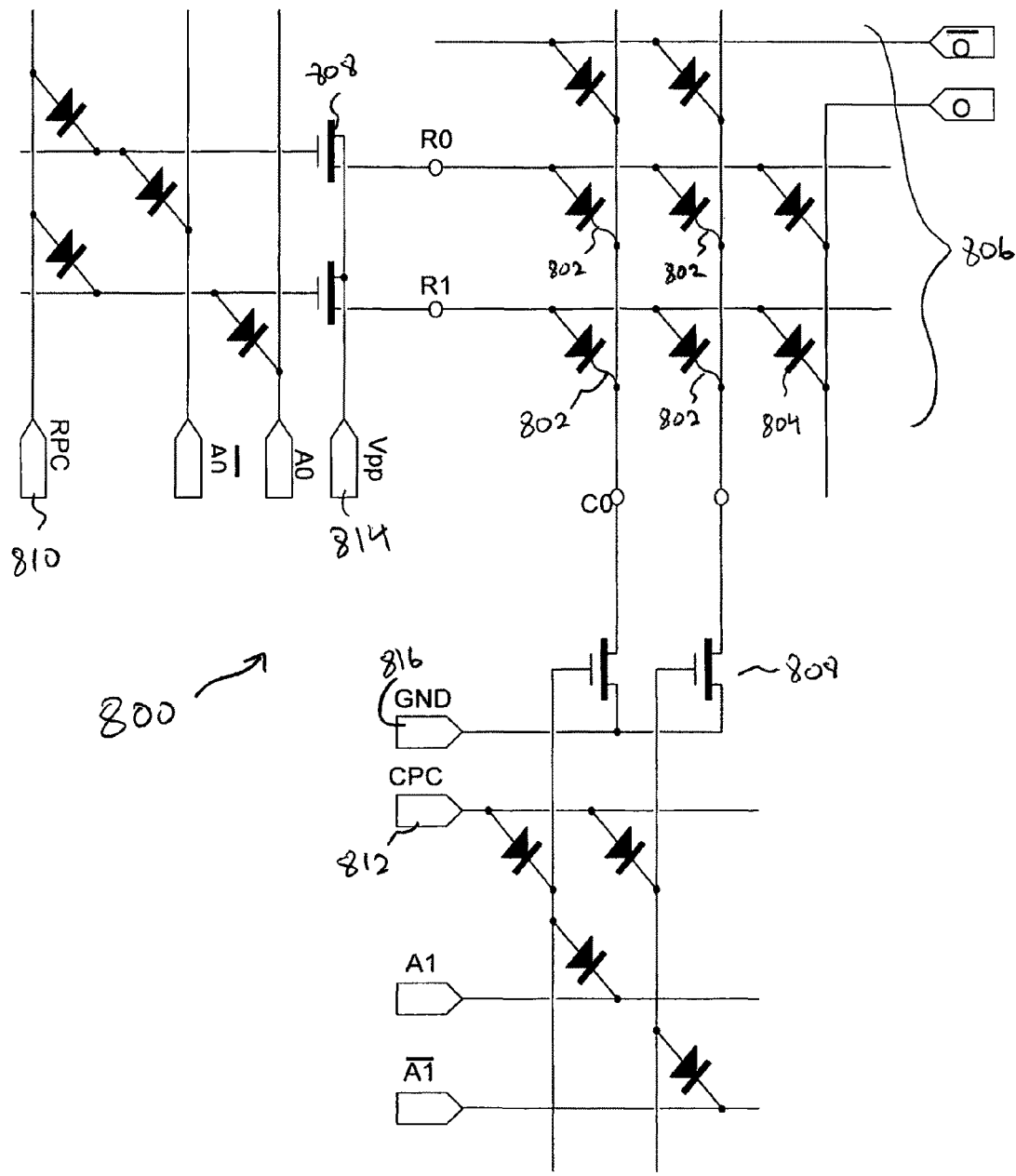
FIG. 8 illustrates a schematic diagram for a variation on the present invention that incorporates buffer drivers in the row lines and column lines.

A variation on the present invention incorporates buffer drivers between the row-address decoders and the diode storage-array row lines as well as between the column decoders and the storage-array column lines. This variation may be desirable when using programmable material that requires a greater voltage and/or current to change the state of a bit at a given location. FIG. 8 shows a simplified schematic diagram 800 of such a variation for a 2×2 array. The curved line 802 at the cathode 804 of the storage bits 806 in the array denotes a programmable material or structure and may be any of a variety of features or properties that facilitate programming, including fuses, antifuses, phase-change materials, and the like as are well understood by those skilled in the art and are disclosed in the prior art.

As is shown in FIG. 8, a buffer driver 808, in this case a single NMOS transistor, is added to each row and column.

Operation of this circuit involves placing a voltage on the row buffer-driver transistor gates sufficient to turn on those transistors by applying that voltage on the row pre-charge (RPC) input 810 (plus an additional amount to account for the forward voltage of the diodes located between the transistor gates and the RPC input), and also placing a voltage on the column buffer driver transistor gates sufficient to turn on those transistors by applying that voltage on the column pre-charge (CPC) input 812 (plus an additional amount to account for the forward voltage of the diodes located between those transistor gates and the CPC input). After charging the capacitance of the respective transistor gates of the row and column transistors, the voltages are removed from the RPC 810 and CPC 812 inputs. Next, the complementary address pairs may be applied, discharging all but one of the row transistor gates and all but one of the column transistor gates (using diode decoders such as, for example, the ones described in U.S. Pat. Nos. 5,889,694 and 5,673,218). At this point, the read voltage or programming voltage may be applied to the $V_{pp}$ input 814—relative to the ground potential applied to the GND input 816—to place approximately that voltage across the bit within the array that is to be read or written. These buffer drivers may be incorporated within the plane of the diode memory array using deposited materials such as amorphous silicon or polysilicon, or as is done when manufacturing TFTs.

Figure 9:
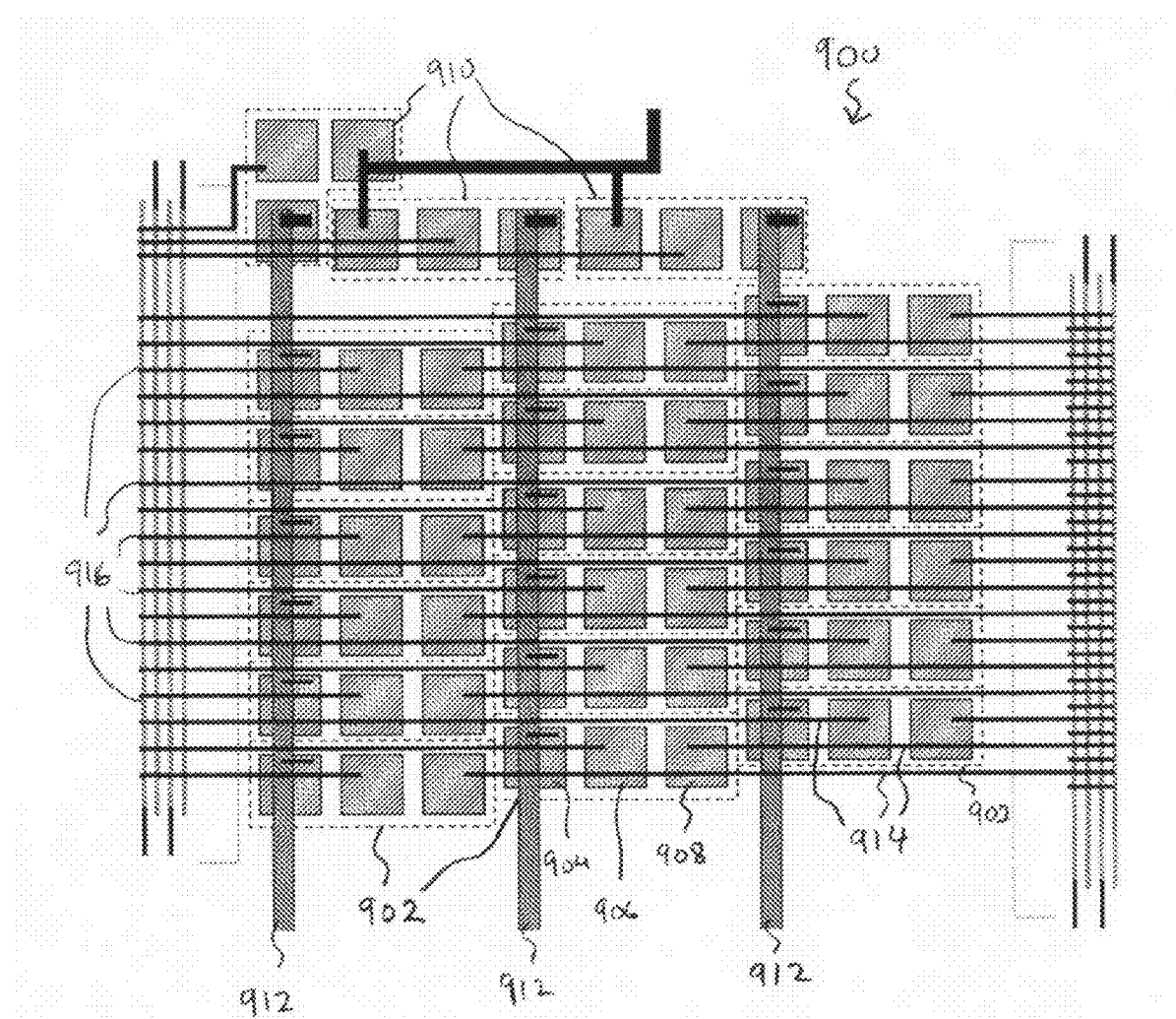
FIG. 9 illustrates an integrated circuit layout for a variation on the present invention that incorporates buffer drivers in the row lines.

In an alternative embodiment, the buffer drivers may be incorporated in a different plane from that of the diode memory array, e.g., the substrate (without necessarily incorporating all of the complexity of a memory controller as mentioned above). Specifically, a single-transistor buffer driver may be fabricated in the substrate without any metal features. E.g., the doped regions of a transistor—source, drain, and contacts, as well as the gate region—may be formed in the substrate, as is well known by those versed in the art. The metal contacts to the doped contact regions may be created when fabricating the layers of diode array storage and decoders above the substrate. Of course additional complexity, including the formation of the metal layers, may be created along with the doped regions, but the advantage of the present approach is that the substrate, without metal patterning, can be manufactured very inexpensively without adding significantly to the overall cost of the finished devices. In addition, the buffer drivers in the substrate may not be fabricated at the same small geometry as the diode arrays disposed above the substrate. FIG. 9 shows one embodiment of a representative layout 900 for doing this for the row lines of the array for a single layer of diode array memory. The columns may be fabricated in a similar fashion.

The transistors to be implemented in the substrate may be constructed in many ways and can be of many types. For example, in one embodiment, the transistors are shallow trench isolated (STI) NMOS transistors. These transistors may be constructed in the substrate by first forming the shallow trench isolation by etching through a barrier oxide/nitride layer following patterning by photolithography. The underlying silicon may then be etched and the trench filled with the isolating dielectric. A poly-silicon gate material may then be deposited, patterned, and etched. The source and drain regions may be implanted with N+ dopants, and the dopants may be activated by a rapid thermal anneal (RTA) and the wafer blanketed with a TEOS oxide fill, according to techniques well understood by those skilled in the art of NMOS transistor design and fabrication. What is unique is that the contact vias are not opened until the M2 to M1 vias of the overlying layer of diodes are formed and the contact metal is not deposited and patterned until the M2 metal of the overlying layer of diodes is deposited and patterned.

In FIG. 9, the single-transistor buffer drivers shown in FIG. 8 are each depicted as three shaded squares surrounded by a dashed rectangle 902. The three squares depict, from left to right for each driver, the contact zones 904, 906, 908 for the source, gate and drain regions, respectively. In addition, there are three individual transistors 910 shown at the top of the FIG. to represent optional drivers to select one of several groups of tiled areas within the array (not shown within the schematic illustrated in FIG. 8), and if it is desired to facilitate addressing within a sub-region. The cross-hatched, vertically running traces 912 represent the Metal 1 (M1) traces and the horizontal black traces 914 represent the Metal 2 (M2) traces of a given diode array memory layer. The end points 916 of the M2 traces represent via contacts going downward to a surface beneath that end point (either a transistor contact area in the substrate layer or an M1 trace within that same diode array memory layer). In FIGS. 8 and 9, only one diode array memory layer is depicted, it being understood that this layer may be part of a multi-layer structure. Many examples of fabricating a deposited array of diodes exist in the prior art and this is well understood by those skilled in the art. The array is typically formed by depositing and patterning the bottom metal (M1) row lines. On these row lines may be deposited the diode stack which can vary from metal-semiconductor Schottky junction formation to P-N junction formation to, preferably, a P-I-N diode layer formation with heavier doped end contacts to reduce contact resistance. This diode film stack may additionally include a top metal contact and/or a layer of programmable material. This diode film stack may be patterned to form a vertically constructed diode at every point on the M1 row lines. An oxide or some other dielectric is then deposited to fill in around the standing pillars of diodes and the wafer is then polished for planarity. Vias are then patterned and etched to make contacts to the tops of the diode pillars and, where needed, to the bottom metal M1 where bottom metal M1 and top metal (M2) are connected. Of interest, when the vias are formed through the layer of oxide or other dielectric material surrounding the vertically constructed diodes in the array, the etch that forms the vias may be chosen to etch the dielectric but not M1 material or silicon. In this way, a M2 to M1 via may stop on M1 when the contact to M1 is opened, but when the contact to be made is to the top of a diode or to a terminal of one of the substrate transistors, the etch continues until an opening has reached the contact terminals of the NMOS transistors in the silicon substrate or the top of a diode. Finally, M2 metal may be deposited and this material fills in the vias thereby making contact to the substrate transistor terminals, to the tops of the diodes, and to the bottom metal M1, as a function of which feature is below a given via being formed, and then M2 is patterned and etched to form the column conductors as well as any other interconnect wiring for the transistors, decoders, and other features and purposes.

In the top view shown in FIG. 9, the vertical dimension of the transistor footprint depicted by the dashed rectangle outlines around the three contact areas of each individual transistor may determine the vertical pitch of the buffer drivers. The ratio of this pitch to the pitch of the row lines in the array determines the number of columns of buffer drivers constructed next to the array. In the figure, the ratio of buffer drivers to row lines is 6:1. This dictates that six columns of buffer drivers are required, three on each side of the array (only the left half is illustrated). The three left-side columns (along with three power busses connecting to the optional drivers to select one of several groups of tiled areas within the array) are shown where each buffer driver of each column drives a single row within the array, and where the rows connecting to a single column constitute a tile within the array. Each column of buffer drivers has a common M1 power bus which connects to the source contact of the driver transistor through a short M2 connection. The right-side columns of buffer drivers are configured in a similar fashion. The column lines within the storage portion of the diode memory array are likewise configured with column buffer drivers as is described here for the row lines and as is indicated in FIG. 8.

It should be noted that when additional layers of diode array memory are added, the effective row pitch (and column pitch) for the above calculation may be increased. If two layers of diode array memory are incorporated, the ratio in the above example may be 12:1 and the transistors may be staggered to allow the vertical connections from each memory layer to connect to their respective buffer driver without interfering with intervening layers of diode array memory. It is possible, however, to avoid this increase in the row (and column) pitch by having two or more layers of diode array memory share the same buffer driver outputs. In this embodiment, the row and column decoders reside within one of the memory array layers or are distributed across multiple memory array layers. Each layer of diode-array memory may be connected at the points shown in FIG. 8 that are labeled with the row and column designations (R0, R1, C0, and C1). The storage portion of each layer (shown in the top right quarter of the figure) may share connections at these points. The outputs from each respective layer may be brought out of the device separately. The address inputs may all be placed within one of the memory layers or can be distributed across several layers (e.g., a second layer of 2×2 memory can incorporate A2, $\overline{A2}$, A3, and $\overline{A3}$ and have separate drop vias to separate buffer drivers in the substrate, or a second layer of 2×2 memory can be added while putting A2, $\overline{A2}$, A3, and $\overline{A3}$ within the first layer of 2×2 memory). Of course, a commercial memory array will have much larger dimensions with many more address lines per layer.

In addition to incorporating optional drivers to select one of several groups of tiled areas within the array, other functions may be incorporated, such as the addition of inverting buffer drivers for the generation of the complementary pairs.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by any claims appended hereto.

What is claimed is:

1. An electronic memory device comprising a plurality of layers of circuitry, wherein:
    a first layer comprises (i) storage circuitry for storing and facilitating retrieval of information and
    (ii) non-storage circuitry contributing to the access of the storage circuitry; and
    a substrate layer, disposed beneath the first layer, comprises a plurality of transistors which receive signals from the first layer.

2. The electronic memory device of claim 1, wherein the first layer is connected to the substrate layer by conductive vias.

3. The electronic memory device of claim 1, wherein the transistors are NMOS transistors.

4. The electronic memory device of claim 1, wherein the transistors are PMOS transistors.

5. The electronic memory device of claim 1, further comprising one or more additional layers.

6. The electronic memory device of claim 1, wherein the storage circuitry for storing and facilitating retrieval of information comprises:
    a first plurality of generally parallel conductors;
    a second plurality of generally parallel conductors overlapping and generally orthogonal to the first plurality of generally parallel conductors; and
    a plurality of nonlinear conductive devices, each device located proximate to a point of overlap between the first and second pluralities of generally parallel conductors.

7. The electronic memory device of claim 6, wherein at least one of the plurality of nonlinear conductive devices is connected to the second plurality of generally parallel conductors proximate to the point of overlap between the first and second pluralities of generally parallel conductors.

8. The electronic memory device of claim 1, wherein the storage circuitry comprises a programmable device.

9. The electronic memory device of claim 8, wherein the programmable device comprises a phase-change material.

10. The electronic memory device of claim 9, wherein the phase-change material comprises a chalcogenide alloy.

11. The electronic memory device of claim 1, wherein the storage circuitry comprises one of a fusible link and an antifusible link.

12. The electronic memory device of claim 6, wherein each of the plurality of nonlinear conductive devices comprises a programmable element.

13. The electronic memory device of claim 1, wherein the non-storage circuitry comprises circuitry for precharging the gate of a transistor.

14. The electronic memory device of claim 1, wherein the non-storage circuitry comprises circuitry for discharging the gate of a transistor.

15. The electronic memory device of claim 1, wherein the non-storage circuitry comprises circuitry for address decoding.

16. The electronic memory device of claim 1, wherein the non-storage circuitry comprises circuitry for output sensing.

17. An electronic memory device comprising a plurality of layers of circuitry, wherein:
    a first layer comprises (i) storage circuitry for storing and facilitating retrieval of information comprising:
        (a) a first plurality of generally parallel conductors;
        (b) a second plurality of generally parallel conductors overlapping and generally orthogonal to the first plurality of generally parallel conductors; and
        (c) a plurality of nonlinear conductive devices, each device connected to the first plurality of generally parallel conductors at approximately a point of overlap between the first and second pluralities of generally parallel conductors, and
    (ii) non-storage circuitry contributing to the access of the storage circuitry; and
    a substrate layer, disposed beneath the first layer, comprises a plurality of transistors which receive signals from the non-storage circuitry,
    wherein each of the plurality of nonlinear conductive devices comprises a fuse, an antifuse, or a phase-change material.

* * * * *